(12) United States Patent
Ma et al.

(10) Patent No.: US 7,705,425 B2
(45) Date of Patent: Apr. 27, 2010

(54) SOLID-STATE HIGH POWER DEVICE AND METHOD

(75) Inventors: Zhenqiang Ma, Middleton, WI (US); Ningyue Jiang, Madison, WI (US)

(73) Assignee: Wisconsin Alumni Research Foundation, Madison, WI (US)

(*) Notice: Subject to any disclaimer, the term of this patent is extended or adjusted under 35 U.S.C. 154(b) by 171 days.

(21) Appl. No.: 11/498,665

(22) Filed: Aug. 2, 2006

(65) Prior Publication Data

US 2006/0267148 A1    Nov. 30, 2006

Related U.S. Application Data

(63) Continuation of application No. 10/993,224, filed on Nov. 19, 2004, now abandoned, which is a continuation-in-part of application No. 10/718,757, filed on Nov. 21, 2003, now abandoned.

(60) Provisional application No. 60/607,762, filed on Sep. 7, 2004, provisional application No. 60/607,767, filed on Sep. 7, 2004.

(51) Int. Cl.
*H01L 29/70* (2006.01)
(52) U.S. Cl. ............................. 257/587; 257/E29.114
(58) Field of Classification Search ................ 257/565, 257/578, 579, 580, 582, 584, 587, E29.111, 257/E29.112, E29.113, E29.114
See application file for complete search history.

(56) References Cited

U.S. PATENT DOCUMENTS

| 3,582,723 | A  |   | 6/1971  | Eindhoven              |
|-----------|----|---|---------|------------------------|
| 3,704,398 | A  |   | 11/1972 | Fukino                 |
| 4,291,324 | A  | * | 9/1981  | Kessler et al. ......... 257/579 |
| 5,374,844 | A  | * | 12/1994 | Moyer ................. 257/582 |
| 6,034,383 | A  | * | 3/2000  | Bayraktaroglu ........ 257/197 |
| 6,586,782 | B1 | * | 7/2003  | Finlay ................ 257/197 |
| 2003/0038341 | A1 | * | 2/2003 | Bayraktaroglu ........ 257/579 |
| 2003/0160302 | A1 | * | 8/2003 | Sankin et al. ......... 257/565 |

* cited by examiner

*Primary Examiner*—Sue Purvis
*Assistant Examiner*—Kevin Quinto
(74) *Attorney, Agent, or Firm*—Foley & Lardner LLP

(57) ABSTRACT

A high-power solid-state transistor structure comprised of a plurality of emitter or gate fingers arranged in a uniform or non-uniform manner to provide improved high power performance is disclosed. Each of the fingers is associated with a corresponding one of a plurality of sub-cells. In an exemplary embodiment, the fingers may be arranged in a 1-D or 2-D form having a "hollow-center" layout where one or more elongated emitter fingers or subcells are left out during design or disconnected during manufacture. In another exemplary embodiment, the fingers may be arranged in a 1-D or 2-D form having one or more "arc-shaped" rows that includes one or more elongated emitter fingers or subcells. The structure can be practically implemented and the absolute thermal stability can be maintained for very high power transistors with reduced adverse effects due to random variation in the manufacturing and design process.

21 Claims, 13 Drawing Sheets

23 fingers

SOLID-STATE HIGH POWER DEVICE AND METHOD

CROSS-REFERENCE TO RELATED APPLICATIONS

This application is a continuation of U.S. patent application Ser. No. 10/993,224 that was filed Nov. 19, 2004, the disclosure of which is incorporated by reference; which is a continuation-in-part of U.S. patent application Ser. No. 10/718,757 that was filed Nov. 21, 2003, the disclosure of which is incorporated by reference. U.S. patent application Ser. No. 10/993,224 claims the benefit of provisional application No. 60/607,767 that was filed Sep. 7, 2004, the disclosure of which is incorporated by reference and of provisional application No. 60/607,762 that was filed Sep. 7, 2004, the disclosure of which is incorporated by reference.

REFERENCE TO GOVERNMENT RIGHTS

This invention was made with United States government support awarded by the following agencies: National Science Foundation, Electrical & Communications System Div., Award No. 0323717. The United States government has certain rights in this invention.

FIELD OF THE INVENTION

The present disclosure relates generally to high power solid-state devices, and more particularly to high power solid-state device structures that are capable of providing high power performance and a corresponding method of design of such structures.

BACKGROUND OF THE INVENTION

High power solid-state devices able to amplify radio frequency ("RF") and microwave signals are used today in a variety of applications, for example in cell phones and other wireless communication systems. Bipolar junction transistors, including heterojunction bipolar transistors (HBTs), are commonly used in such systems for amplifying small-amplitude signals and delivering amplified RF power to an antenna. Although bipolar junction transistors (BJTs) are used herein to describe the background of this invention, this is by way of example and does not limit the scope of the invention disclosed herein.

High power solid-state devices for amplifying RF and microwave signals can be fabricated using a variety of materials, but silicon germanium ("SiGe") and gallium arsenide ("GaAs") are the most widely used materials for commercial applications at the present time. Most power amplifiers for cell phones are made using GaAs, because current fabrication technologies using that material can deliver devices with relatively high power output (1-4 W) at the relatively low frequencies (800 Mhz-1.9 Ghz) used by most cell phones. Most power amplifiers for wireless networking products use SiGe, because current fabrication technologies using that material can allow high level integration to reduce cost deliver devices that can operate at somewhat higher frequencies (2.4 Ghz-60 Ghz) but at the reduced power (10-200 mW typical) used by wireless networking products such as 802.11b ("WiFi"). Besides the electronic properties which differ between GaAs and SiGe devices, the two different materials also have different thermal conductivities which require somewhat different techniques for heat management.

The effective range of a wireless communication system depends on the maximum RF power that can be produced by that wireless communication system. The maximum RF power that can be produced by a device depends on the active device area, with the power capacity increasing as the active device area increases.

The bandwidth, or information transmission capacity, of a wireless communication system depends on the maximum frequency range that can be amplified effectively by that wireless communication system. As the power capacity and associated active device area of a device increases, the adverse effects of heat and increased parasitics also increase, so in practice it is generally the case that increasing the power capacity of a given device will decrease the maximum frequency range that can be amplified effectively by that device.

Especially for wireless communication systems, such as cell phones, that use batteries for electrical power, the so called power added efficiency ("PAE") at which input battery power is converted to usable RF power (instead of being wasted, for example, as heat) determines how long such a device can be used before it must be recharged. For the reasons discussed above, device designs that maximize power added efficiency and RF power output while maintaining adequate high frequency performance are needed.

As discussed above, the power capacity of an active device increases as the active device area increases. For example, the maximum RF power level that can be produced by a BJT depends on the emitter area of the BJT, with the maximum RF power level increasing as the emitter area increases. Because of problems such as the emitter current crowding effect, it is known to divide the total emitter area of a BJT into multiple emitter "fingers" separated from one another. It is also known that the specific arrangement of these multiple emitter fingers can affect many aspects of the performance of such a device.

FIG. 1 shows an exemplary prior art BJT 20 having a base 22, emitter 24, collector 25, and multiple emitter fingers 26 separated by a uniform distance X 28. Although FIG. 1 is a compact layout that saves chip area, this type of layout is known to have poor thermal stability and performance due to severe thermal coupling between emitter fingers (they are too close) and excessive parasitic collector resistance.

FIG. 2 shows another exemplary prior art BJT 30 also having multiple emitter fingers 26. Unlike the device of FIG. 1, the multiple emitter fingers of the device of FIG. 2 are grouped into four subcells 32, with each of the four subcells 32 having two emitter fingers 26. In the device of FIG. 2, the subcells 32 are separated from one another by collector regions, with a uniform distance Y 34 between the centers of adjacent subcells 32. The device 30 of FIG. 2, although somewhat less compact than the device 20 of FIG. 1, is known to provide reduced collector resistance and thermal effects in exchange for the increased device area.

Although the device 20 of FIG. 1 and the device 30 of FIG. 2 have somewhat different performance characteristics, both devices have uniform spacing between the multiple emitter fingers 26 (in the device of FIG. 1) and between the multiple subcells 32 (in the device of FIG. 2). It is known that devices having uniformly spaced emitter fingers 26, or uniformly spaced emitter finger subcells 32, are typically subject to adverse thermal effects caused by a higher and localized device temperature rise in the center of these types of devices during operation, as further explained below.

When the transistors in the devices of FIGS. 1 and 2 are initially biased, equal current passes through each emitter finger 26, and this equal current produces an equal amount of heat in each finger. Over time, heat dissipates more slowly from the center fingers compared to the fingers on the periphery of the device. This is because the center fingers are surrounded by other emitter fingers that are also producing heat, unlike the peripheral fingers which are adjacent to cooler inactive regions where there are no emitter fingers producing heat. For this reason, devices like those of FIGS. 1 and 2 tend to operate with a non-uniform temperature distribution wherein the center fingers are hotter than the edge fingers.

It is also known that the non-uniform temperature distribution common to these types of devices can make them unstable at high output levels. The higher temperature of the center fingers can cause the so-called "current hogging" effect, wherein the higher temperature center fingers draw more current than the peripheral fingers subject to the same bias voltage. Current hogging occurs when the increased temperature of the center fingers causes an increase in current through those center fingers. The increased current through the center figures increases the heat produced in those center fingers, which in turn exacerbates the temperature difference between the hotter center fingers and the cooler peripheral fingers. Even if this effect does not cause the device to go completely unstable, it can nonetheless severely degrade device performance, for example by decreasing high frequency gain. In the worst case, thermal runaway and catastrophic failure occurs.

One prior art approach to improve the thermal stability and maintain a uniform junction temperature across the multiple emitter fingers 26, or multiple subcells 32, of a power transistor, is to connect equally- or unequally-valued ballast resistors 38 in series with each emitter finger 26 as shown in the device 36 of FIG. 3 and the device 40 of FIG. 4. These ballast resistors 38 typically have values in the range of 20-100 ohms, and provide a negative feedback mechanism between temperature and current of the emitter fingers or subcells. When more current is drawn by the center emitter finger 26 or subcell 32 due to the rising of temperature, the voltage drop across the ballast resistors 38 increases. Hence, the voltage available to the emitter fingers 26 is reduced and less heat is thus generated by these fingers.

Although ballast resistors 38 can provide thermal stability and improve temperature uniformity across the multiple emitter fingers 26, or emitter finger subcells 32, the use of ballast resistors 38 can adversely affect important measures of device performance. First, using ballast resistors will tend to reduce the maximum RF power output from the device. This is because the emitter fingers and subcells in series with the ballast resistors will be underbiased compared to a device without ballast resistors, since the available bias voltage must be shared between the ballast resistors and the remainder of the device. In addition, the ballasting resistors increase the RC delay and thereby adversely affect the high frequency performance of the device. Finally, the voltage drop across the ballast resistors ends up as heat instead of as RF output power, thereby wasting power and reducing the efficiency ("PAE") of converting DC supply power into RF signal power for the power transistors.

Another prior art approach to improve the thermal stability and maintain a uniform junction across the multiple emitter fingers of a power transistor is to make the spacing between the emitter fingers non-uniform. This approach is discussed, for example, in U.S. Pat. No. 6,534,857. In this type of layout, the emitter finger spacing is non-uniform, with more spacing between the emitter fingers in the center region and less spacing between the edge fingers. The spacing is arranged with the goal of providing a uniform junction temperature across the emitter fingers. Similar benefits can be obtained by using progressively narrower widths of emitter fingers from the periphery toward the center region of the power transistor, or by using progressively shorter emitter finger lengths from the periphery toward the center region of the power transistor, for example as shown in U.S. Pat Nos. 5,616,950 and 5,850,099.

The aforementioned techniques involving non-uniform dimensioning and placement of the emitter fingers theoretically might produce thermal stability and uniform junction temperature regardless of the total number of emitter fingers in such a device. However, there are important practical limitations to this technique, especially for very large power transistors.

First, although it may be possible to calculate to a high degree of precision the dimensions and positions for emitter fingers that will optimize thermal stability and uniformity, it is much more difficult to actually manufacture emitter fingers in accordance with those calculated optimal dimensions and locations. The lithographic processes used to manufacture the emitter fingers always have statistical variations that cause the widths and locations of the emitter fingers to vary. This variation can be caused, for example, by variations in the optical column or mask used to print the emitter fingers, by variations in the photoresist or developer used to image the emitter fingers, or by variations in the etch or deposition processes used to prepare the emitter fingers. This variation can manifest itself, for example, in finger-to-finger variation within a transistor, in transistor-to-transistor variation within a batch, or in day-to-day variation between batches.

Second, although it may be possible to calculate to a high degree of precision the dimensions and positions for emitter fingers that will optimize thermal stability and uniformity, practical chip layout tools do not provide for arbitrarily small increments of dimensions and positions in design rules. Thus, especially when the dimensions and spacings of the emitter fingers are of the same order of magnitude as the minimum feature size available in the process being used to manufacture the transistors and/or the minimum dimension and location increments of the design rules of the software used to layout the transistor, there are important practical limits to realizing absolute uniformity of temperature and temperature stability using the prior art techniques involving non-uniform dimensioning and spacing of the emitter fingers.

Moreover, when the number of emitter fingers arranged in a single row becomes very large, the spacing non-uniformity of the emitter fingers residing in the center region of a power transistor becomes very gradual. As shown in FIG. 5, while emitter fingers 1 and 10 of a 10-finger power transistor fall on the outside edges of that 10-finger transistor, emitter fingers 1 and 10 of a 20-finger power transistor fall within the central area of that 20-finger transistor. Hence, more spacing will be required around emitter fingers 1 and 10 in the 20-finger transistor compared to the 10-finger transistor.

In comparison to the 10-finger power transistor where emitter fingers No. 4-7 are the center fingers, emitter fingers (No. 4-No. 16) in the 20-finger power transistor are all center fingers. The available space in the center area must be shared among all the center fingers, thus the central area of a 20 finger device becomes crowded because the edge area in a 20-finger device remains the same as in the 10-finger device. The difference in the theoretically optimum spacing between, for example, emitter fingers 4 and 5 and the spacing between emitter fingers 5 and 6 in a 20-finger device can be very small. The above-described practical limitations in manufacturing and design introduce variation in the dimensions and locations of emitter fingers that can result in significant temperature non-uniformity once the device's operation reaches its steady state.

Exacerbating the problem is the fact that the larger is the total number of emitter fingers in a power transistor, the higher is the junction temperature (FIG. 6). That is, without any statistical variations in emitter finger locations and dimensions, devices with a large number of emitter fingers run hotter than similarly constructed devices with fewer emitter fingers. Because devices with large numbers of emitter fingers run hotter, statistical variations in emitter fingers and locations can render these devices especially susceptible to current "hogging" due to the formation of local hot spots, or thermal runaway trigged by local non-uniformity of emitter finger width, e.g., statistical variation of the lithography feature size.

As a result, the dimensions and locations of the emitter fingers can be quite critical, and even small variations in dimensions can create large variations in temperature uniformity. FIG. 7(a) shows an exemplary prior art 23-emitter finger GaAs HBT, with nominal 2 µm finger width and nominal 20 µm finger length. The emitter fingers of the device of FIG. 7(a) are arranged in a non-uniform fashion to produce theoretically uniform junction temperatures, assuming that-the emitter fingers are manufactured to have perfect locations and dimensions.

FIGS. 7(b) and 7(c) present calculated steady-state temperature and current distributions of the device of FIG. 7(a) under the assumption that process variation has increased the width of the No. 12 emitter finger 42 to 2.02 µm. That is, the No. 12 emitter finger 42 is assumed to be 1% wider than the nominal 2 µ width of the other emitter fingers in the device of FIG. 7(a). FIG. 7(b) shows the calculated temperature profile across the emitter fingers resulting from this 1% variation in width of the no. 12 emitter finger 42. FIG. 7(c) shows the calculated current profile across the emitter fingers resulting from this 1% variation in width of the no. 12 emitter finger 42 during steady-state high power operation. These results show that even slight variations in finger dimensions can substantially degrade temperature uniformity and cause current hogging.

Generally, as the number of emitter fingers increases, smaller finger width variations will produce current hogging and temperature non-uniformity. Similarly, higher operating temperatures and higher output power tend to increase these adverse effects on temperature uniformity caused by process variation.

In summary, practical limitations in the manufacturing and design of power transistors having a very large number of emitter fingers limit the utility of non-uniform dimensioning and location of emitter fingers in achieving temperature uniformity and thermal stability in such devices. As a result, these prior art techniques are mainly useful for low and medium power transistors where not many emitter fingers are required. What is needed is a power transistor structure suitable for high power transistors using large numbers of emitter fingers and having better power performance, improved manufacturability, and more reliable thermal stability compared to prior-art power transistor structures. What is further needed are structures and dimensions which are particularly suited for SiGe applications, and other structures and dimensions which are particularly suited for GaAs applications.

SUMMARY OF THE INVENTION

An exemplary high power transistor includes a plurality of emitter fingers fabricated on a common semiconductor chip. The emitter electrodes may be bipolar junction transistors or heterojunction bipolar transistors in the form of parallel elongated finger elements having a uniform or non-uniform spacing. The fingers may be arranged in a 1-dimensional (1-D) or 2-dimensional (2-D) form such that the potential thermal instability at high power operation is reduced or eliminated. In an exemplary embodiment, the fingers may be arranged in a 1-D or, 2-D form having a "hollow-center" layout where one or more elongated emitter fingers or subcells are left out during design or disconnected during manufacture. In another exemplary embodiment, the fingers may be arranged in a 1-D or 2-D form having one or more "arc-shaped" rows that includes one or more elongated emitter fingers or subcells.

Other principal features and advantages of the invention will become apparent to those skilled in the art upon review of the following drawings, the detailed description, and the appended claims.

BRIEF DESCRIPTION OF THE DRAWINGS

Exemplary embodiments of the invention will hereafter be described with reference to the accompanying drawings, wherein like numerals will denote like elements.

DETAILED DESCRIPTION OF THE EXEMPLARY EMBODIMENTS

Figure 1:
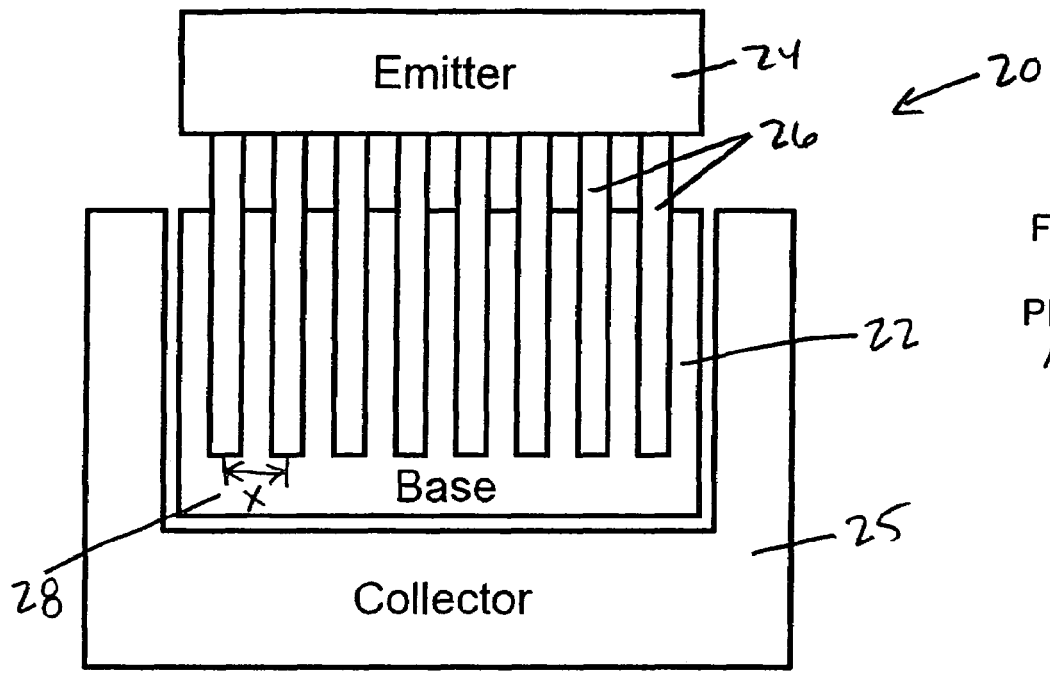
FIG. 1 is a top planar view of the layout of a prior-art power bipolar junction transistor having a plurality of uniformly-spaced emitter fingers.
Figure 2:
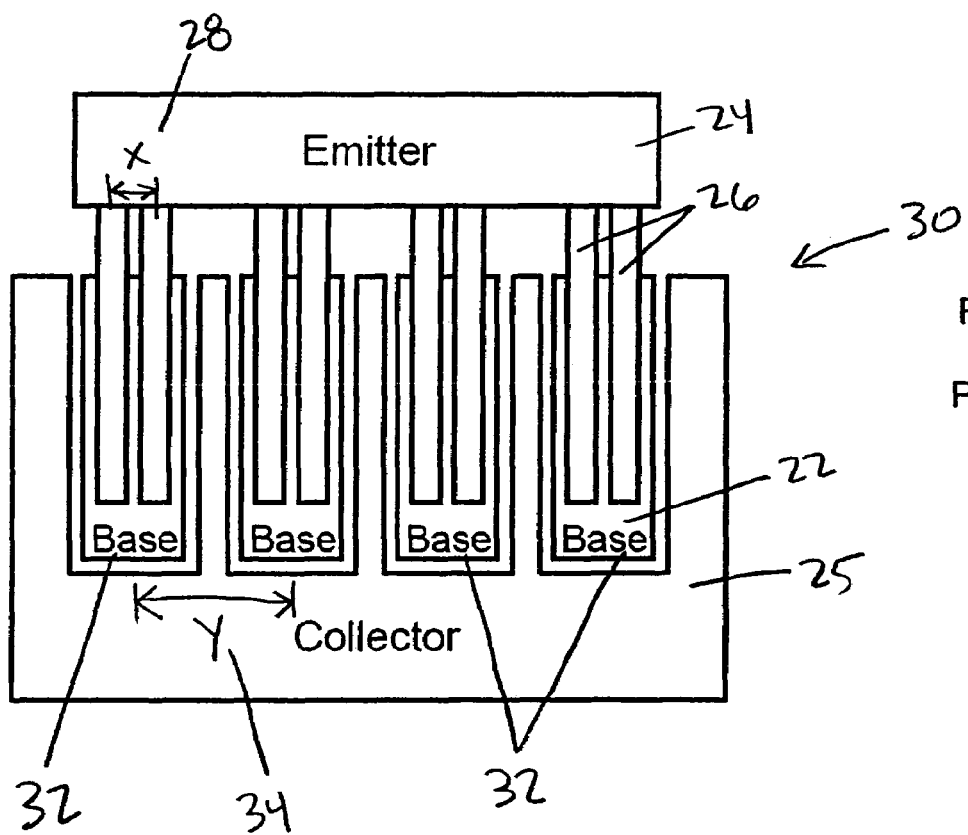
FIG. 2 is a top planar view of the layout of a prior-art power bipolar junction transistor having a plurality of emitter fingers arranged in uniformly spaced subcells each having 2 emitter fingers.
Figure 3:
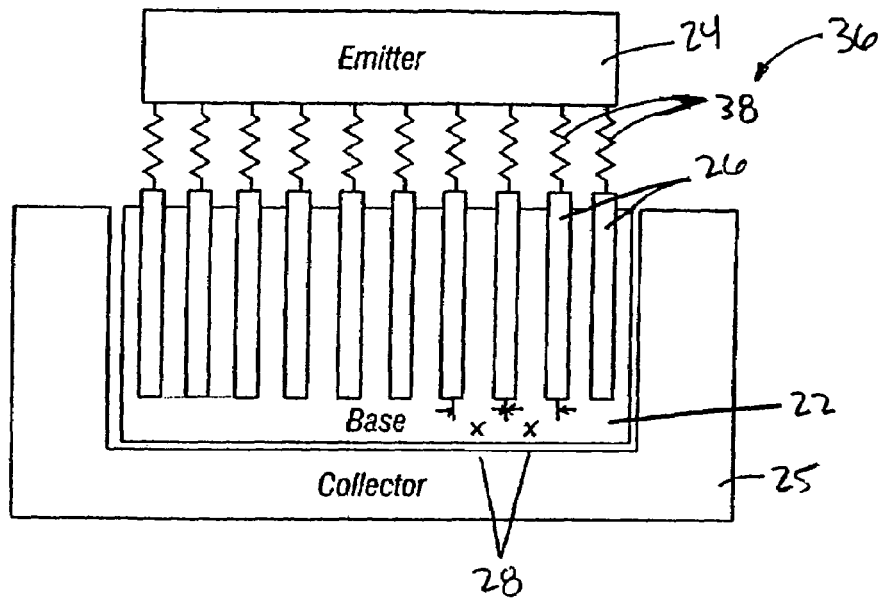
FIG. 3 is a top planar view of the layout of a prior-art power bipolar junction transistor having a plurality of uniformly-spaced emitter fingers each with a ballast resistor.
Figure 4:
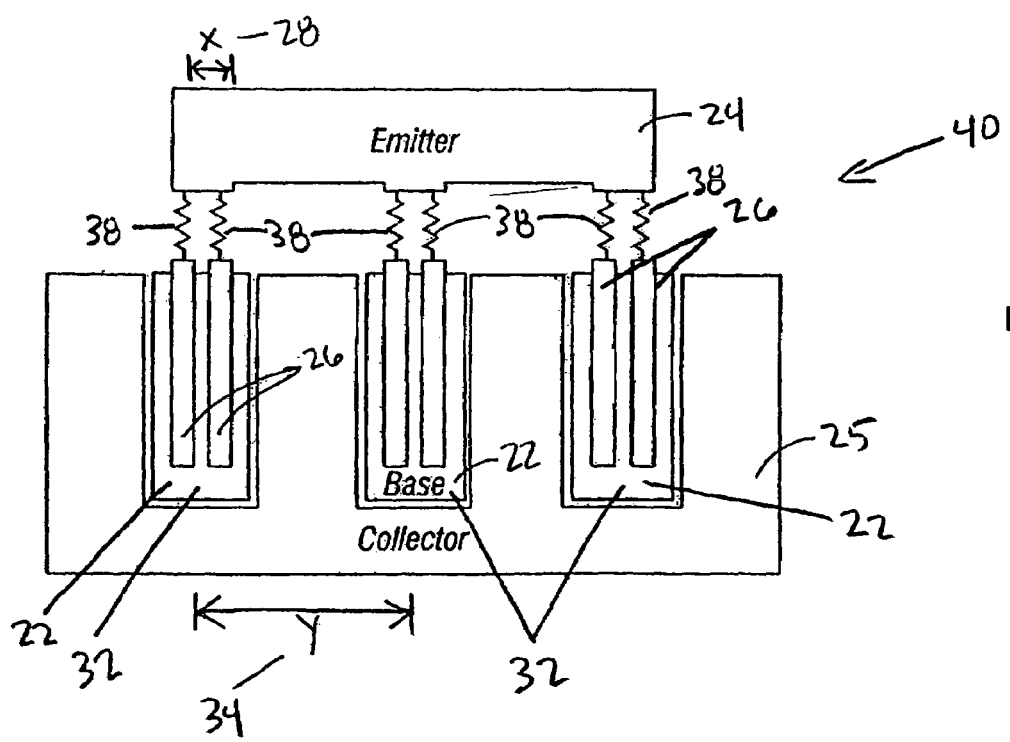
FIG. 4 is a top planar view of the layout of a prior-art power bipolar junction transistor having a plurality of emitter fingers arranged in uniformly-spaced subcells each having 2 emitter fingers each with a ballast resistor.
Figure 5:
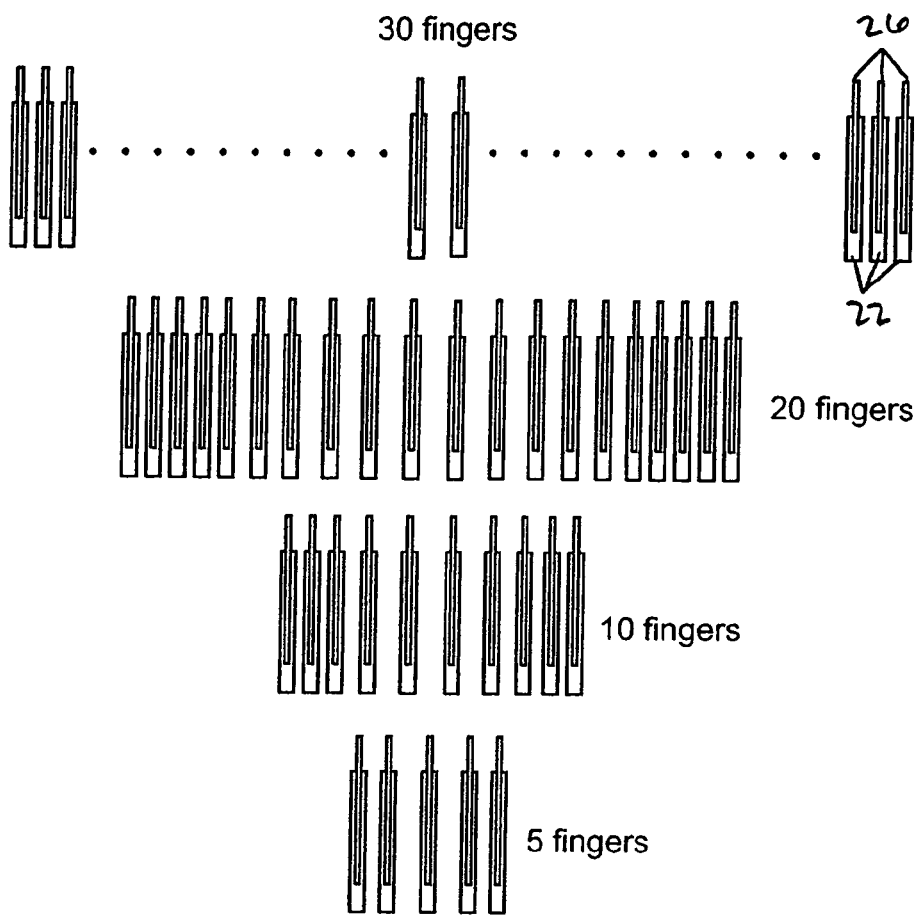
FIG. 5 is a top planar view of the layouts of four exemplary prior-art power bipolar junction transistors having 5, 10, 20, and 30 emitter fingers arranged non-uniformly.
Figure 6:
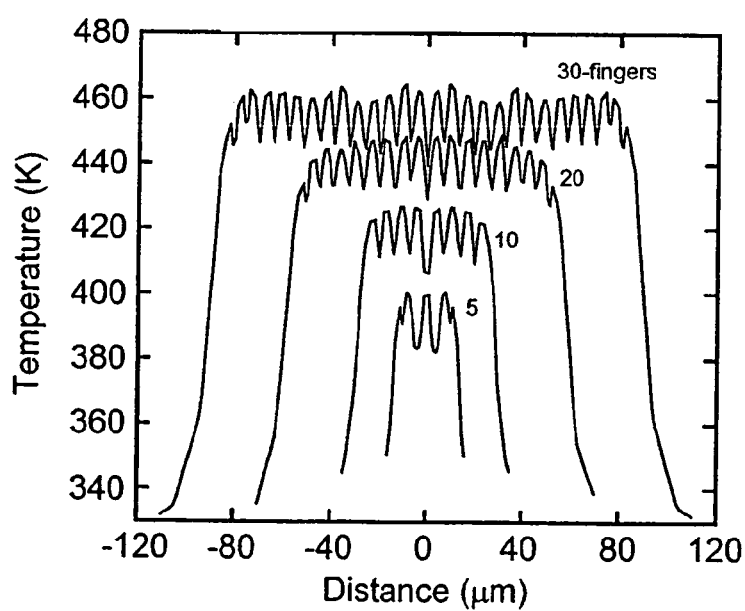
FIG. 6 presents calculated temperature profiles for the four exemplary power bipolar junction transistor layouts of FIG. 5.
Figure 7A:
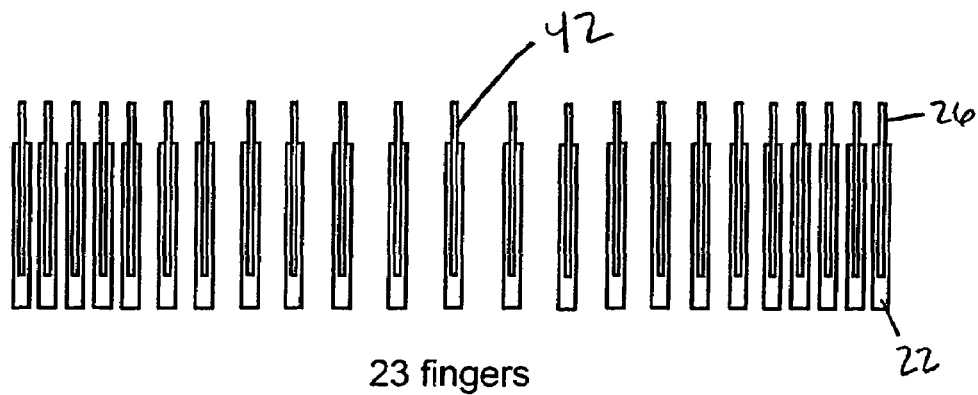
FIG. 7(a) is a top planar view of the layout of a prior-art power bipolar junction transistor having 23 emitter fingers arranged non-uniformly.
Figure 7B:
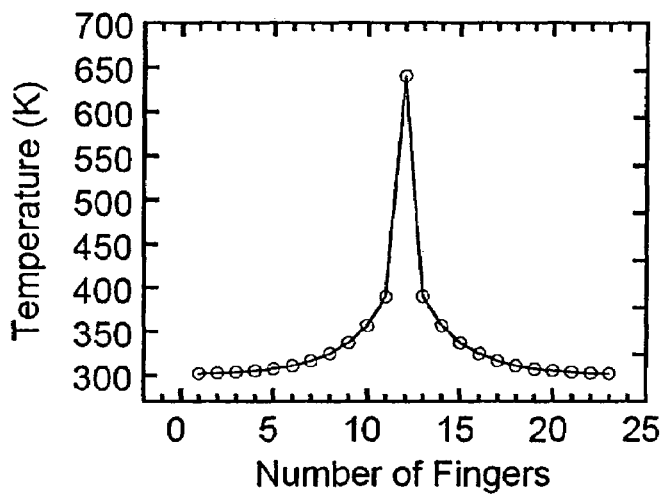
FIG. 7(b) shows the calculated temperature profile during steady-state high power operation of the device of FIG. 7(a) assuming that emitter finger number 12 is 1% wider than intended.
Figure 7C:
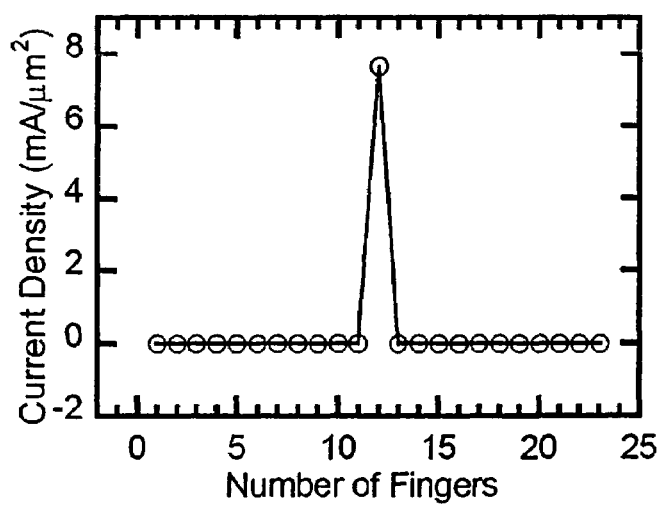
FIG. 7(c) shows the calculated current profile during steady-state high power operation of the device of FIG. 7(a) assuming that emitter finger number 12 is 1% wider than intended.

As previously discussed, high power transistors commonly employ multiple finger structures to increase the total power output. For bipolar junction transistors and heterojunction bipolar transistors, these multiple fingers are emitter fingers. Although the following embodiments of this invention are described using bipolar junction transistors as examples, the bipolar junction transistors are used by way of example, and not as a limitation on the scope of the invention.

By way of example, and not as a limitation, FIGS. 8(a)-8(f) show an exemplary prior art fabrication process for fabricating a SiGe bipolar junction power transistor having two emitter fingers. The prior art process of FIGS. 8(a)-8(f), sometimes called the double-mesa process, can be used for fabricating X-band SiGe HBT devices. This prior art process is highly repeatable and reliable, and typically employs 7 mask levels and 20 steps. This prior art process is used herein as an example of a process for implementing SiGe or GaAs power transistors using the specific dimensions and device layouts of the present invention, but it is by no means the only such process that could be used.

The exemplary process of FIGS. 8(a)-8(f) begins with a material stack formed on an Si substrate 62, followed by a heavily N-type doped Si subcollector layer 60, a lightly n-type doped Si collector layer 58, a p-type doped SiGe base layer 56, and an n-type doped Si emitter layer 53. Emitter metal contacts 52 are formed using standard photolithography and liftoff techniques. The emitter metal 52, for example Cr or Au, is first evaporated on top of the highly doped emitter cap layer 53 of the Si/SiGe/Si heterostructure. The multi-emitter metal fingers 52, typically 2 microns wide, are formed with the first-level mask, leaving the structure shown in FIG. 8(a). The width of the emitter fingers may be subject to statistical variations as discussed above.

Figure 8A:
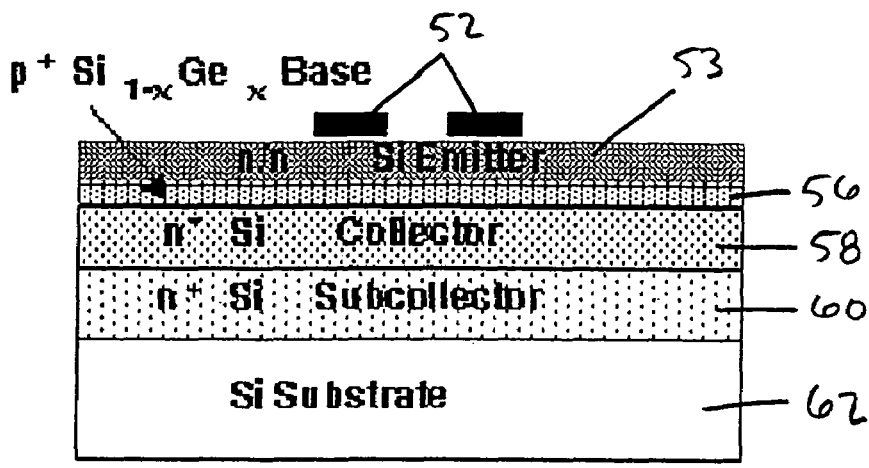
FIGS. 8(a)-8(f) show an exemplary fabrication process for fabricating a SiGe (a similar process can be used for GaAs) bipolar junction power transistor having two emitter fingers.
Figure 8B:
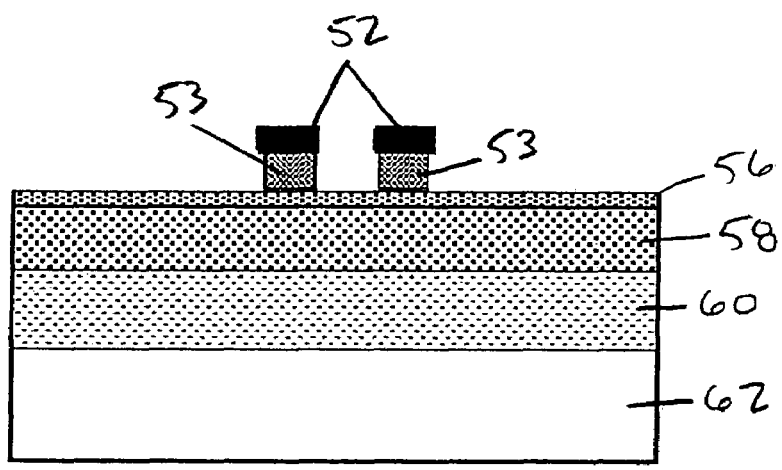
Figure 8C:
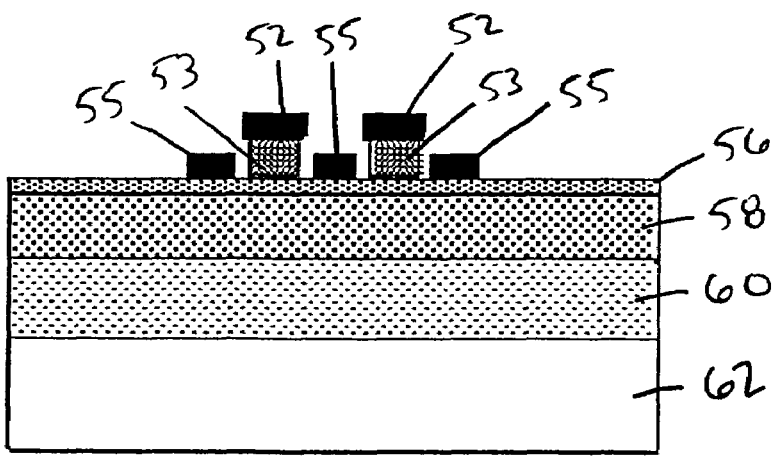

The patterned emitter metal fingers 52 then serve as self-aligned mask for subsequent dry/wet etching of the Si emitter layer 53 to expose the boron-doped SiGe base layer 56, leaving the structure shown in FIG. 8(b). Another photolithography step is used to form self-aligned base metal 55 on top of the exposed SiGe base layer 56, leaving the structure shown in FIG. 8(c).

Figure 8D:
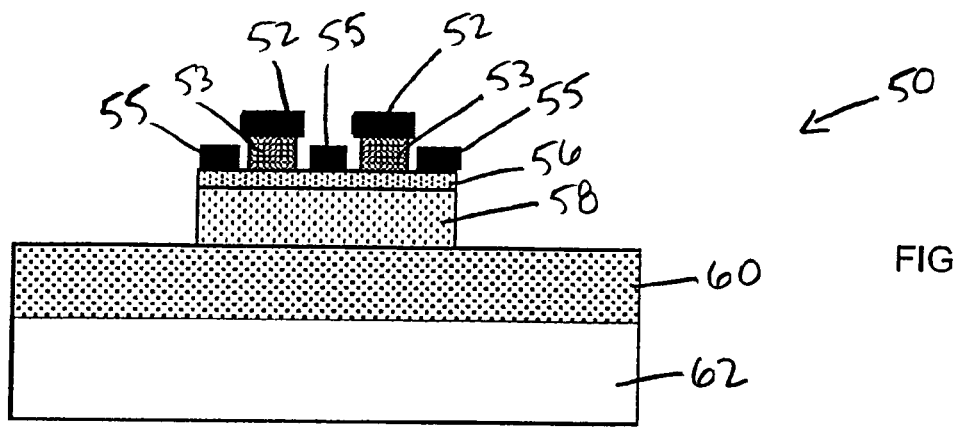
Figure 8E:
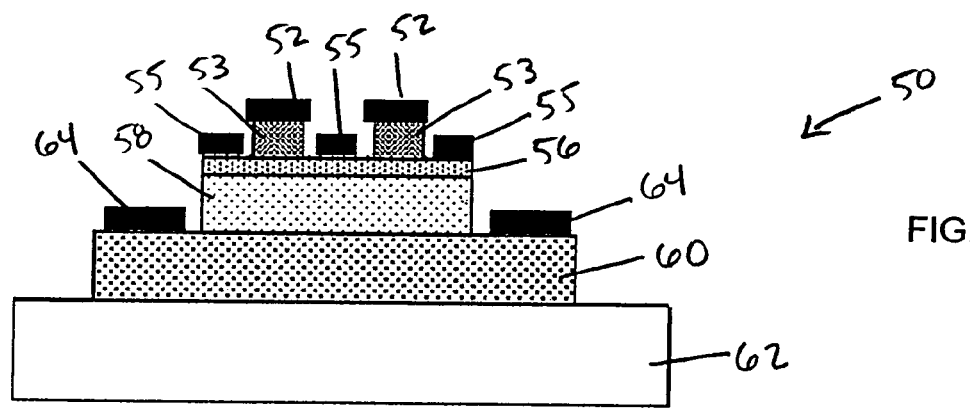
Figure 8F:
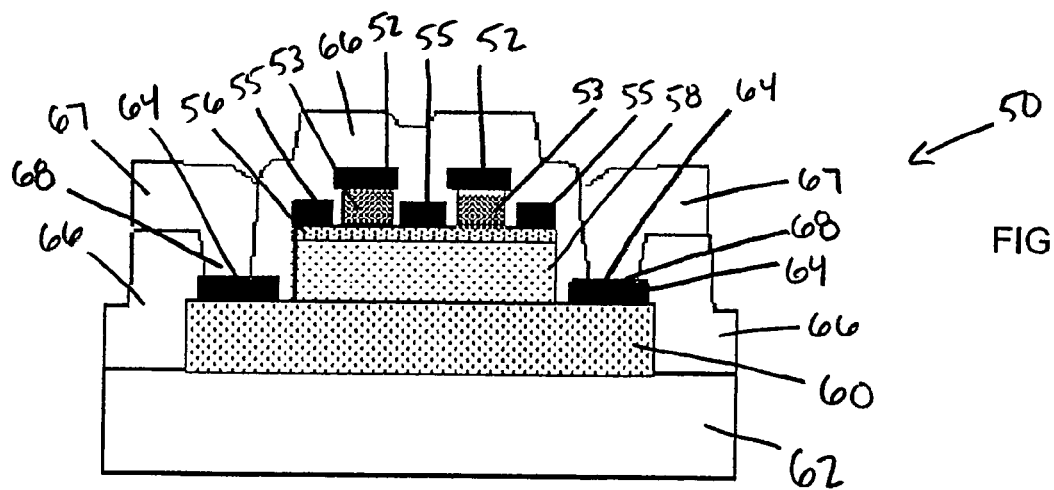

The third mask is used to form the base mesa by RIE and to expose the highly doped subcollector layer 60 for collector contact formation, leaving the structure shown in FIG. 8(d). Next, collector metal 64 is deposited and formed in another lithography step (4th mask). The active devices are isolated by removing the subcollector material 60 around the devices and exposing the high-resistivity Si substrate 62 (5th mask), leaving the structure shown in FIG. 8(e).

A conformal PECVD SiO2 deposition is used to form a passivation layer 66 over the active device 50 and the exposed substrate 62. Contact via holes 68 are opened in the passivation layer 66 by RIE (6th mask) and interconnect pad metal 67 is deposited and then patterned with photolithography (7th mask) to finish the fabrication process and form the completed device 50 shown in FIG. 8(f).

Figure 9:
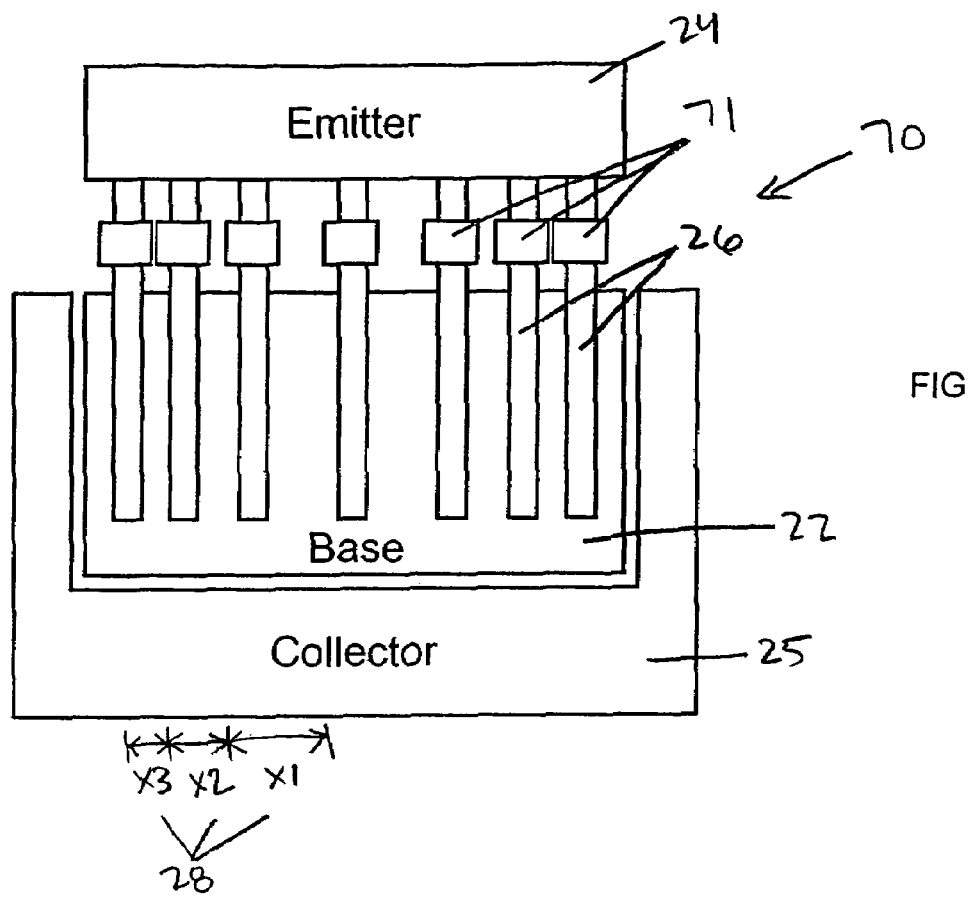
FIG. 9 is a top planar view of a power bipolar junction transistor according to an exemplary embodiment having non-uniformly spaced emitter fingers.

Referring to the drawings, FIG. 9 is a top planar view of a power bipolar junction transistor 70 according to an exemplary embodiment having non-uniformly spaced emitter fingers 26 with small ballast resistors 71. In the device 70 of FIG. 9, a non-uniform spacing of emitter fingers 26 is arranged using the finite element analysis software, based on the known heating power density. The side-to-side or lateral distance between adjacent emitter fingers 26 increases from the center of the device 70 to the periphery, so that distance X1>X2>X3.

The arrangement of the multiple emitter fingers 26 must adhere to the applicable design rules of the technology used to build the device. Since any design rule will have some minimum allowable increment of distance, even if the perfect placement and spacing of the multiple emitter fingers can be calculated, this perfect placement and spacing cannot be implemented in practice, so at least some non-uniformity of junction temperature should be expected.

In the device 70 of FIG. 9, the emitter fingers 26 of this power transistor are each connected in series with a small ballast resistor 71, although this is not required and less than all of the emitter fingers may include the small ballast resistor 71. For example, in an appropriate application small ballast resistors 71 can be omitted from the emitter fingers 26 on the periphery while maintaining small ballast resistors 71 on at least some of the central emitter fingers 26 to maintain temperature stability. The small ballast resistor is preferably in the range 1-10 ohms.

In an appropriate fabrication process, such a small valued ballast resistor can be formed simply by shrinking the size of a contact hole 68 to the emitter 24, for example to the emitter metal 52, to create the desired resistance in series with the emitter finger 26, with no additional structure or processing step required. The values of the resistors in accordance to the preferred embodiment are calculated based on the known maximum statistical variation of the finger width with the goal of a thermally stable operation condition. The calculation may involve iterations using measured or calculated thermal-electric coefficients and heating power density.

Although the small ballast resistors 71 are connected to emitter fingers in the device 70 of FIG. 9, similar layouts with small ballast resistors 71 connected in series with the base 22 can also be used, instead of or in addition to small ballast resistors 71 in series with the emitter 24. In an appropriate fabrication process, such a small valued ballast resistor can be formed simply by shrinking the size of a contact hole to the base 22, for example to the base metal 55, to create the desired resistance in series with the base 22, with no additional structure or processing step required.

In comparison to the prior-art approach which uses ballast resistors 38 having values in the range of 100 ohms, the small ballast resistors 71 in the device 70 of FIG. 9 have values in the range 1-10 ohms, preferably around 1-3 ohms, and these small ballast resistors 71 are used to prevent thermal instability caused by small variations of finger spacing and finger width. As a result, only a very small fraction of ballast resistor values of the prior-art ballast resistor values is needed in this invention. Hence, the small ballast resistors 71 of this approach can have significantly improved power, efficiency, and high frequency performance compared to prior approaches that use larger ballast resistors 38.

Figure 10:
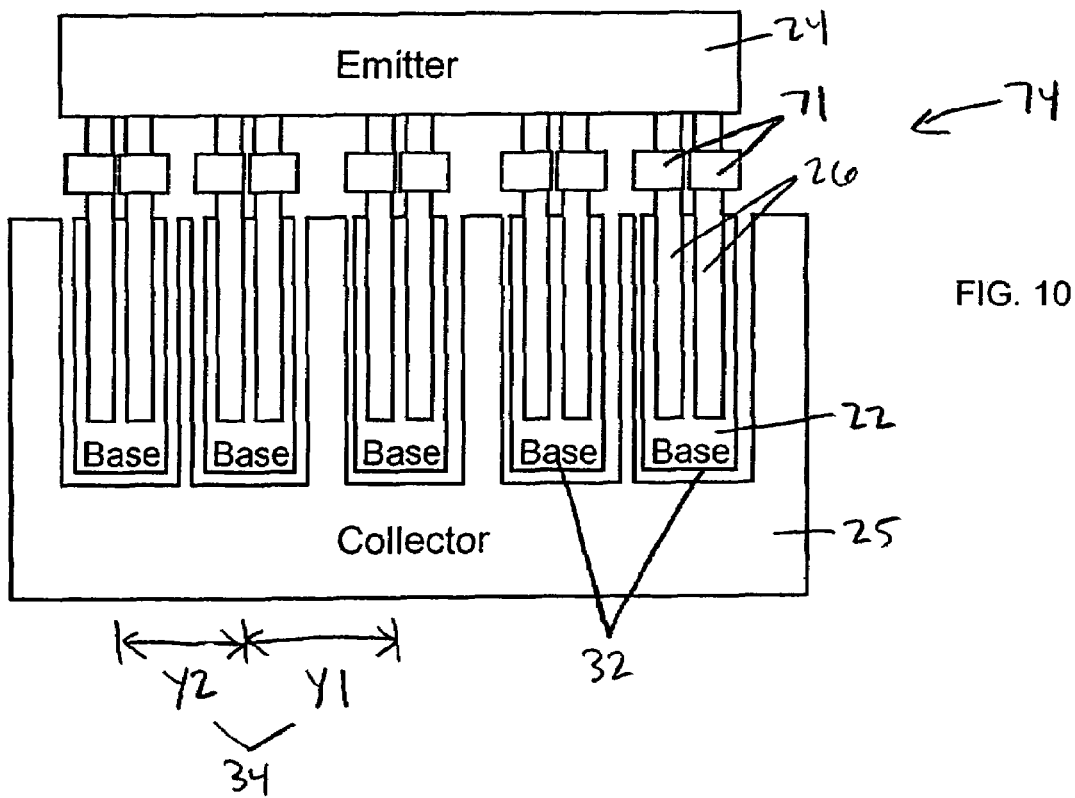
FIG. 10 is a top planar view of another power bipolar junction transistor according to an exemplary embodiment having emitter fingers arranged in non-uniformly spaced subcells each having 2 emitter fingers.

FIG. 10 is a top planar view of another power bipolar junction transistor 74 according to the invention having emitter fingers 26 arranged in non-uniformly spaced subcells each having 2 emitter fingers with small ballast resistors. Although two fingers are grouped in a subcell in this example, more fingers can be grouped together if the finger width is small. The non-uniform layout is arranged by adhering to the design rule. The side-to-side or lateral distance between adjacent subcells 32 increases from the center of the device 74 to the periphery, so that distance Y1>Y2. To ensure worst-case thermal stability, the values of the small ballast resistors can be determined by assuming the width of all the emitter fingers in the center subcell or subcells have the maximum possible finger width and assuming the distance between the central adjacent subcells is the minimum, given the expected variation in finger width and subcell spacing in the manufacturing process used. The advantages of this small ballast resistor approach are reduced base-collector junction capacitance and parasitic collector resistance in comparison to the prior art which uses relatively large ballast resistors.

Figure 11A:
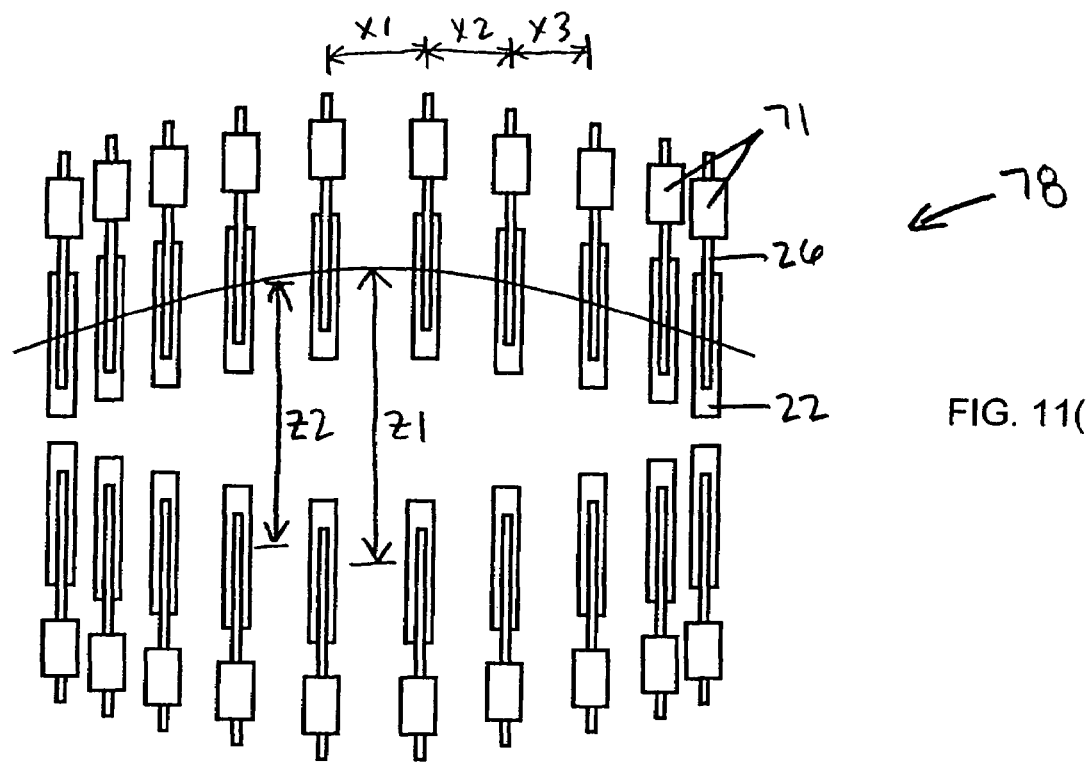
FIG. 11(a) is a top planar view of another power bipolar junction transistor according to an exemplary embodiment having non-uniformly spaced emitter fingers arranged in two arc-shaped rows.

FIG. 11(a) is a top planar view of another power bipolar junction transistor 78 according to an exemplary embodiment having non-uniformly spaced emitter fingers 26 each with a small ballast resistor 71 and arranged in two arc-shaped rows. The dimensions and arrangement of the 2-dimensional thermally balanced structure is designed to avoid the need for larger valued ballast resistors 38 to ensure thermal stability of the device 78 arising from the statistical variation of finger width and allowable minimal increment of emitter finger spacing in the one-row non-uniform layout. The side-to-side or lateral distance between adjacent emitter fingers 26 increases from the center of the device 78 to the periphery, so that distance X1>X2>X3. The front to back distance between the rows of adjacent emitter fingers 26 also increases from the center of the device 78 to the periphery, so that distance Z1>Z2. Of course, the arrangement of the two rows of emitter fingers 76 must adhere to the design rules of the process used to manufacture the device 78.

Figure 11B:
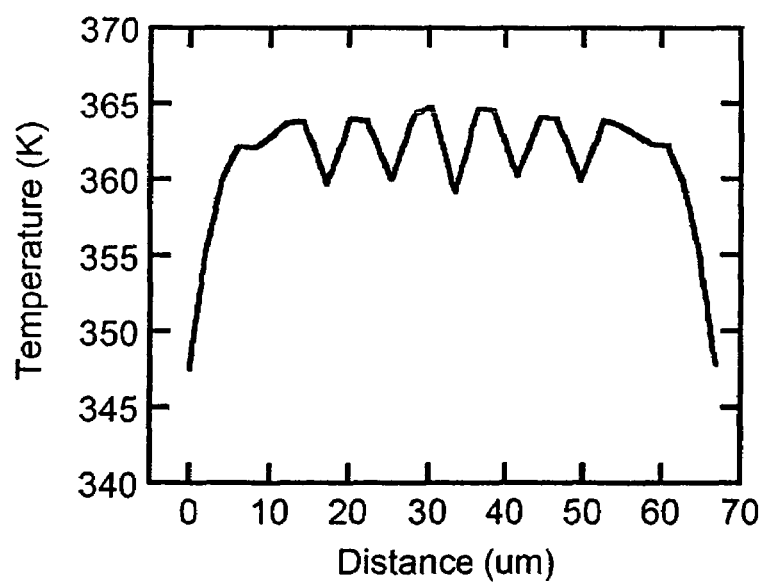
FIG. 11(b) shows the calculated temperature profile along one row of emitter fingers in the device of FIG. 11(a)

FIG. 11(b) shows the calculated temperature profile along one row of emitter fingers of the device 78 of FIG. 11(a). The temperature non-uniformity shown in FIG. 11(b) due to the limitation of minimal increment of finger spacing is expected. The values of small ballast resistors 71 can be selected in a similar fashion to the devices of FIGS. 9 and 10, by assuming that the central emitter fingers 26 have the maximum finger width and minimum spacing expected in the manufacturing process used to fabricate the device 78, to ensure worst case thermal stability.

Although the device of FIG. 11(a) includes a single finger structure for illustration, subcell structures with two or more emitter fingers grouped together can also be used. Again, small ballast resistors 71 can be placed in series with the base 22, instead of or in addition to small ballast resistors 71 in series with the emitter 24.

In addition, although arc-shaped rows are used for the illustration of the 2-D thermal balance structure in the device of FIG. 11(a), the two rows can be straightened up. In either case, the spacing between two rows affects the selection of ballast resistor values of the emitter fingers. Using small ballast resistors 71 having similar values to the small ballast resistors 71 used in the device 70 of FIG. 9, the thermally stable power output of a device similar to that of FIG. 11(a) but with two straightened up rows may be substantially greater than the device of FIG. 9 with similar device area.

Figures 12A, 12B:
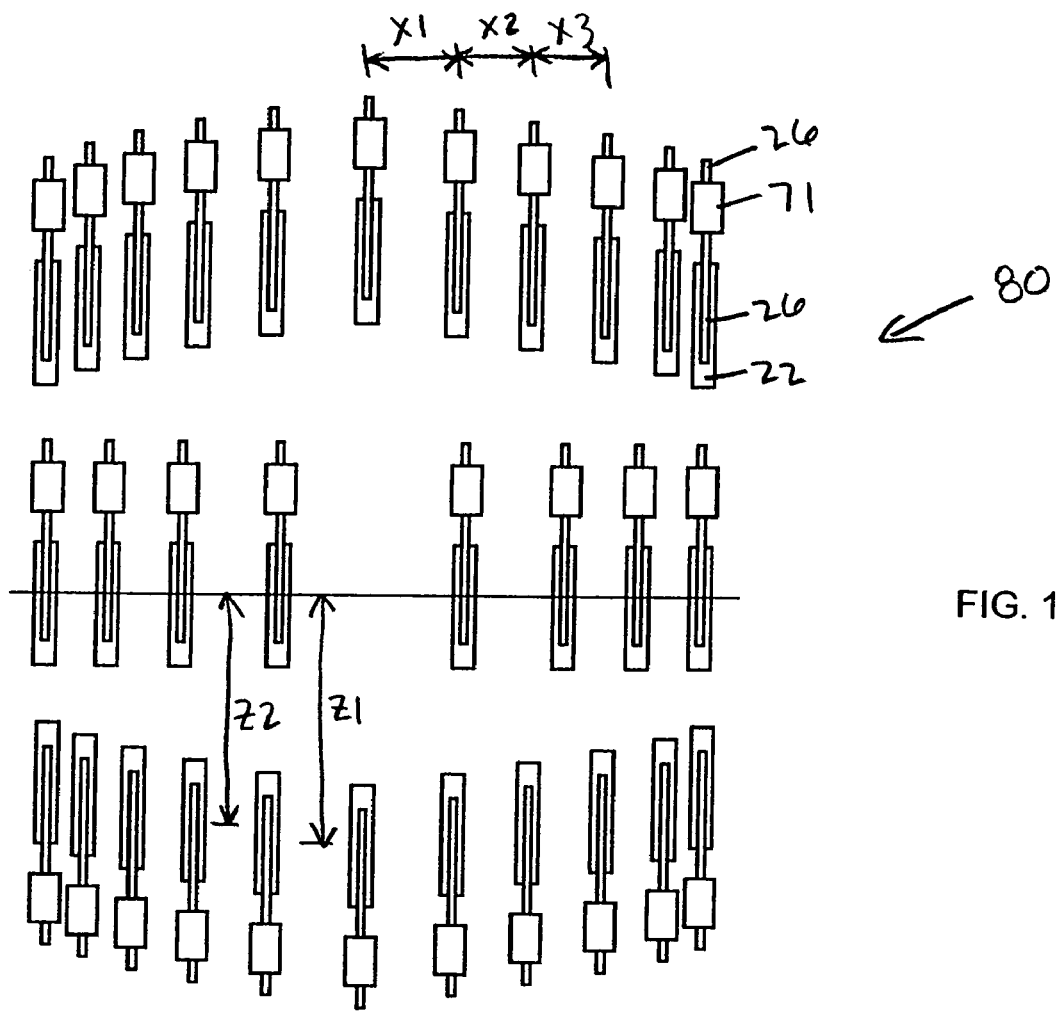
FIG. 12(a) is a top planar view of another power bipolar junction transistor according to an exemplary embodiment having non-uniformly spaced emitter fingers arranged in two arc-shaped rows surrounding a third straight center row of fingers.
FIG. 12(b) is the calculated temperature profile along the center row of emitter fingers in the device of FIG. 12(a)

FIG. 12(a) is a top planar view of another power bipolar junction transistor 80 according to an exemplary embodiment having non-uniformly spaced emitter fingers 26 each having a small ballast resistor 71 and arranged in two arc-shaped rows surrounding a third straight center row of fingers. The side-to-side or lateral distance between adjacent emitter fingers 26 increases from the center of the device 80 to the periphery, so that distance X1>X2>X3. The front to back distance between the rows of adjacent emitter fingers 26 also increases from the center of the device 80 to the periphery, so that distance Z1>Z2. Although a three-row layout is shown in FIG. 12(a) as an example, layouts of more than three rows can also be used. Although all the emitter fingers 26 in device 80 include small ballast resistors 71, this is not necessary and in an appropriate case fewer than all the emitter fingers 26 may include a small ballast resistor 71, and the values of the small ballast resistors 71 need not all be the same.

FIG. 12(b) is the calculated temperature profile along the center row of emitter fingers 26 in the device 80 of FIG. 12(a). Similar to the device of FIG. 11(a), temperature nonuniformity is expected when a design rule is adhered to, because of the imprecision in emitter finger placement resulting from the finite resolution of design rules. Subcell structures 32 can replace the single emitter finger structures 26 and small ballast resistors 71 instead of or in addition to small emitter ballast resistors 71 can also be used in a device 80 according to an exemplary embodiment similar to that of FIG. 12(a). In addition, all the multiple rows can be straightened up and the center row or rows can have smaller number of emitter fingers or subcells than the outer rows. The values of the small ballast resistors 71 can be selected in a similar fashion to the device of FIG. 9.

Figure 13:
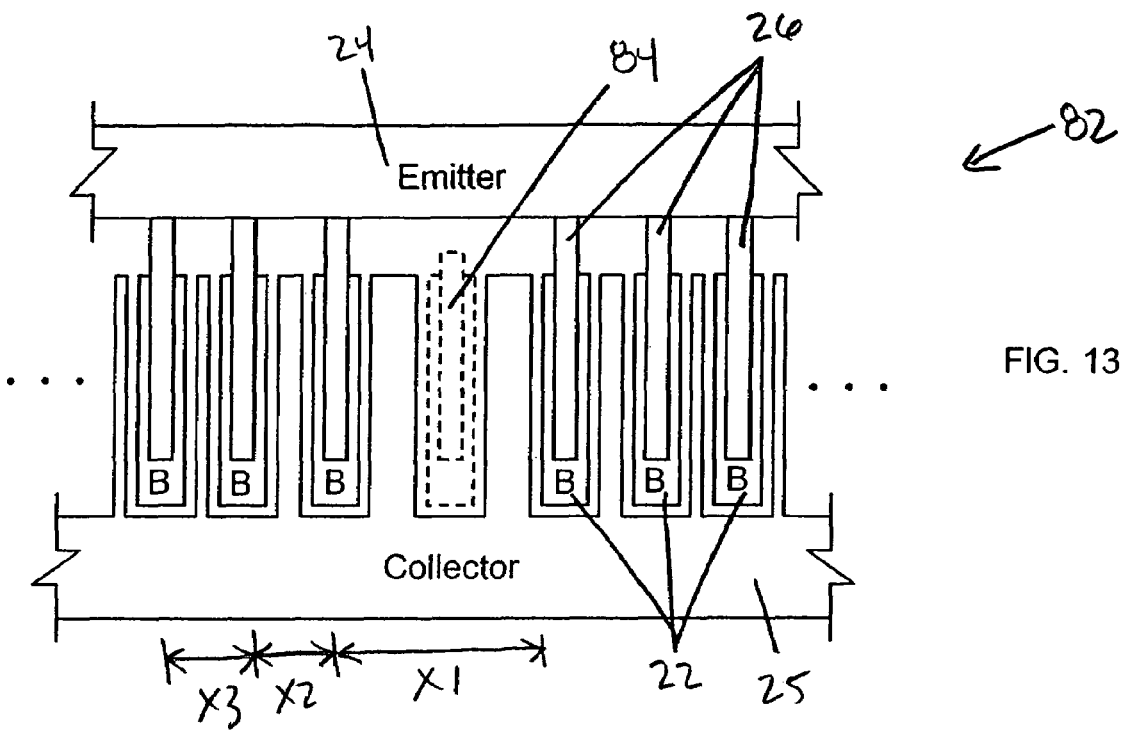
FIG. 13 is a top planar view of another power transistor structure according to an exemplary embodiment with emitter fingers surrounding a "hollow center" central gap where an emitter finger is missing.

FIG. 13 is a top planar view of another power transistor structure 82 according to an exemplary embodiment with non-uniformly spaced emitter fingers surrounding a central gap ("hollow center") 84. Like the device 70 of FIG. 9, the side-to-side or lateral distance between adjacent emitter fingers 26 increases from the center of the device to the periphery, so that distance X1>X2>X3. However, in the device 82 of FIG. 13, the side-to-side distance X1 is much greater than the side-to-side distance between other pairs of adjacent emitter fingers, whereby X1 is more than twice as large as the distance between any other two pairs of adjacent emitter fingers.

Using the "hollow center" 84 in the device 82 of FIG. 13, the multiple emitter fingers may be arranged either in a uniform or non-uniform fashion while adhering to the design rule, and still achieve thermally stable operation. Instead of seeking a nearly uniform temperature distribution, the hollow center 84 in the device of FIG. 13 can result in a non-uniform temperature where the center is cooler than the periphery, to overcompensate and make the device 82 even more thermally stable.

The potential thermal instability that may be triggered by the deviation from the required emitter finger spacing and/or by statistical variation of finger width is ameliorated using the hollow center 84. The hollow center 84 can be implemented by placing a gap at the center of the device 82 when designing the device, or the hollow center 84 can be implemented by electrically disconnecting or removing one or more of the center emitter fingers 26 after the device 82 has been partially fabricated.

The "hollow center" 84 can be applied to layouts of multiple rows and can also be applied to a single row at locations instead of or in addition to center locations when the number of emitter fingers is sufficiently large. Although a non-uniform arrangement of emitter fingers is preferred, it is not required for this embodiment, and the "hollow center" 84 can be used even when all the other emitter fingers are uniformly spaced. Accordingly, both uniform and non-uniform arrangements of emitter fingers using the "hollow center" 84 can be used in a device according to an exemplary embodiment. The device 82 of FIG. 13 may also include one or more small valued ballast resistors 71 connected to one or more of the emitter fingers or the base, although this is not required.

Figure 14:
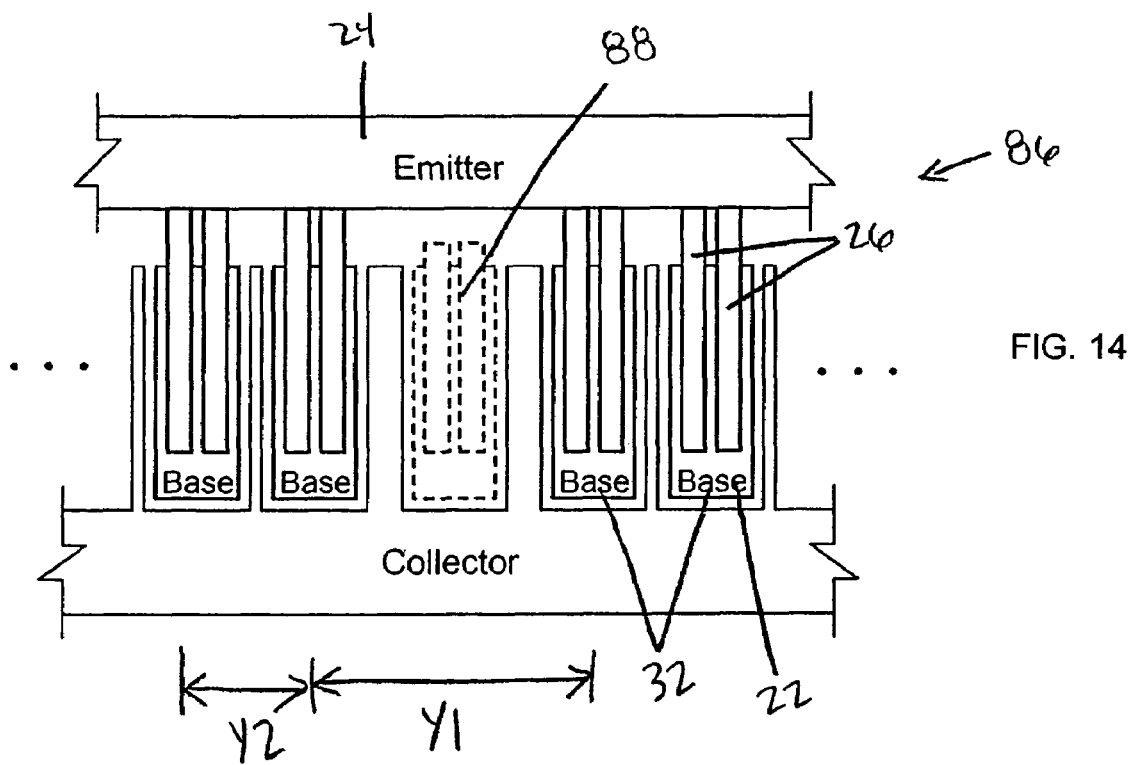
FIG. 14 is a top planar view of another power transistor structure according to an exemplary embodiment with subcells each having two emitter fingers and surrounding a "hollow center" central gap where a subcell is missing.

FIG. 14 is a top planar view of another power transistor structure 86 according to an exemplary embodiment with non-uniformly spaced subcells 32, each with two emitter fingers 26, surrounding a "hollow center" 88 central gap. Although the device 86 of FIG. 14 has subcells 32 containing two emitter fingers 26, this is not required and subcells containing a greater number of emitter fingers could be used.

Like the device 74 of FIG. 10, the side-to-side or lateral distance between adjacent subcells 32 increases from the center of the device to the periphery, so that distance Y1>Y2. However, in the device 86 of FIG. 14, the side-to-side distance Y1 is much greater than the side-to-side distance between other pairs of adjacent subcells, whereby Y1 is more than twice as large as the distance between any other two pairs of adjacent subcells.

The hollow center 88 can be formed by electrically disconnecting or removing selected subcells during manufacture or the hollow center 88 subcells can be simply left out during layout of the device. The device 86 of FIG. 14 may include one or more small valued ballast resistors 71 connected to one or more of the emitter fingers and/or the base, although this is not required.

Figure 15:
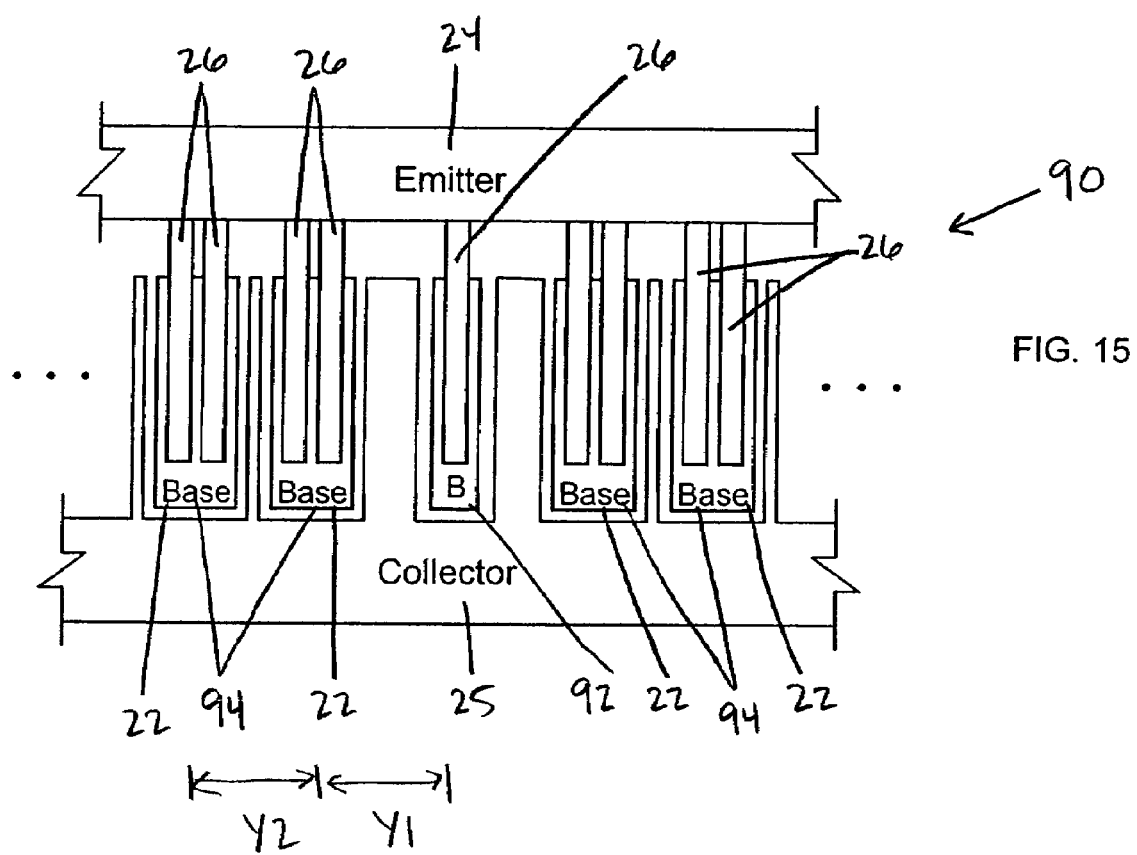
FIG. 15 is a top planar view of another power transistor structure according to an exemplary embodiment with non-uniformly spaced subcells, each with two emitter fingers, surrounding a central subcell having a single emitter finger.

FIG. 15 is a top planar view of another power transistor structure 90 according to an exemplary embodiment with subcells 94, each with two emitter fingers, surrounding a central subcell 92 having a single emitter finger. Like the device 74 of FIG. 10 and the device 86 of FIG. 14, the side-to-side or lateral distance between adjacent subcells increases from the center of the device to the periphery, so that distance Y1>Y2. However, in the device 90 of FIG. 15, the central subcell has a reduced number of emitter fingers compared to the other subcells, instead of a "hollow center" subcell 88 used in the device 86 of FIG. 14.

Although the device 90 of FIG. 15 includes one single-finger central subcell 92 surrounded by other subcells 94 each containing 2 emitter fingers, the surrounding subcells 94 could have a greater number of emitter fingers. Similarly, if the surrounding subcells have a greater number of emitter fingers, the central subcell could also have a greater number of emitter fingers, as long as the number of emitter fingers in the central subcell 92 is less than the number of emitter fingers in the surrounding subcells 94. The device 90 of FIG. 15 may also include one or more small ballast resistors 71 connected to one or more of the emitter fingers and/or the base.

Figure 16A:
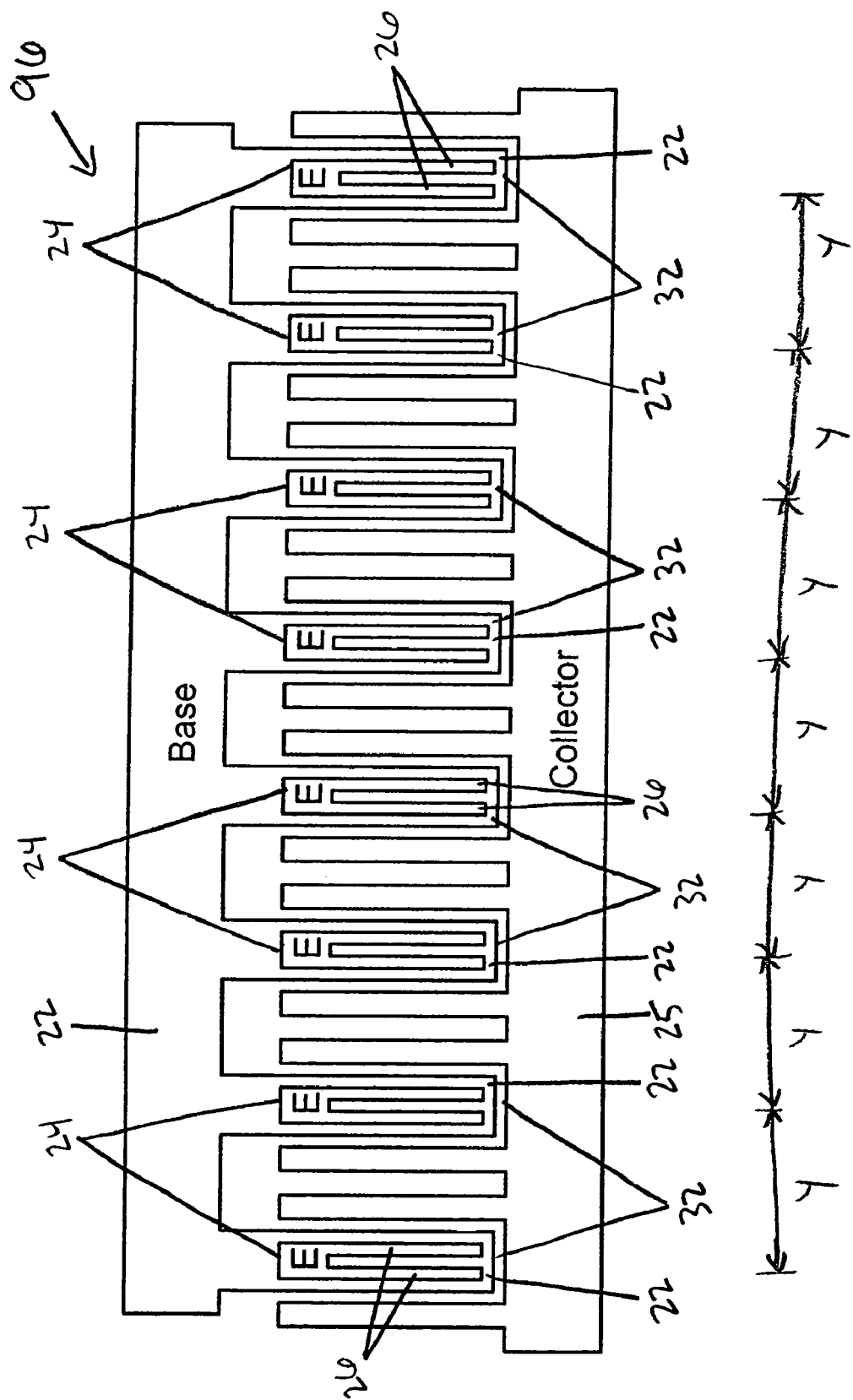
FIG. 16(a) is a top planar view of an exemplary prior-art bipolar power transistor layout.
Figure 16B:
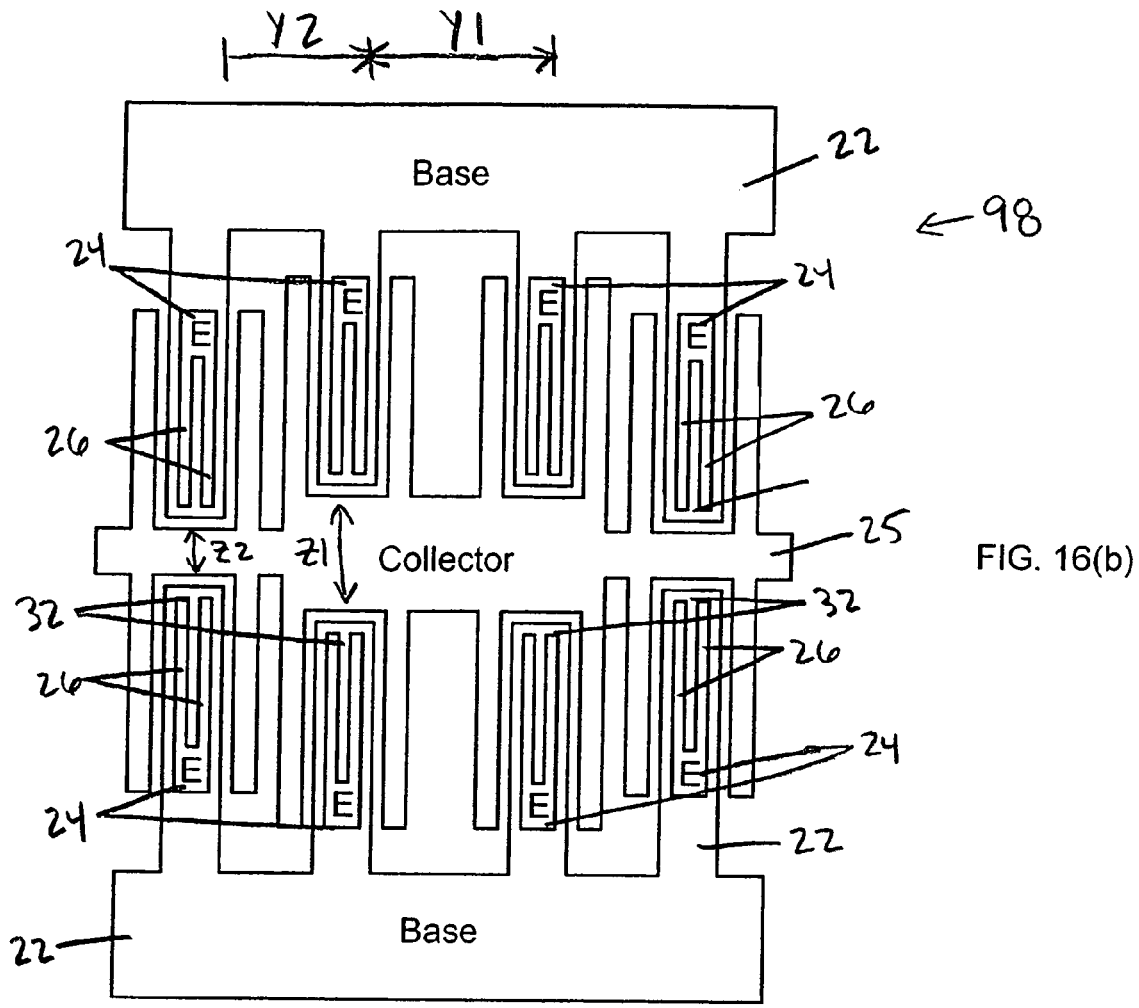
FIG. 16(b) is a top planar view of a power transistor in accordance with an exemplary embodiment having the same number of emitter fingers and subcells, and the same chip area, as the device of FIG. 16(a)
Figure 16C:
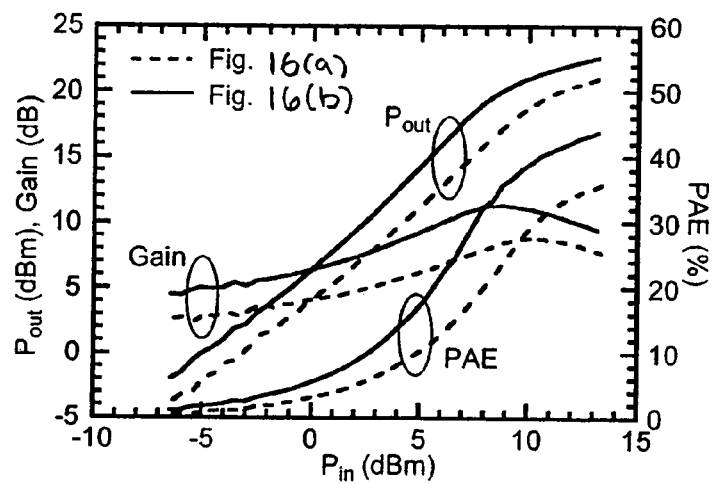
FIG. 16(c) shows the measured power performance data of the device of FIG. 16(b) compared to the prior art device of FIG. 16(a).

FIG. 16(*a*) is a top planar view of an exemplary prior-art SiGe HBT power transistor 96 with a uniform layout. The 16 emitter fingers 26 are grouped in 8 subcells 32 and uniformly spaced along a single row. FIG. 16(*b*) is a top planar view of a power transistor 98 in accordance with an exemplary embodiment having the same number of emitter fingers and subcells, and the same chip area, as the device 96 of FIG. 16(*a*).

Unlike the uniformly-spaced single row of subcells used in the device 96 of FIG. 16(*a*), the device 98 of FIG. 16(*b*) includes 8 subcells arranged non-uniformly in a 2-dimensional form, in accordance with an exemplary embodiment, while keeping the same chip area and the same subcell structure as the device 96 of FIG. 16(*a*). The side-to-side or lateral distance between adjacent subcells 32 increases from the center of the device 98 to the periphery, so that distance Y1>Y2. The front to back distance between the rows of adjacent subcells 32 also increases from the center of the device 98 to the periphery, so that distance Z1>Z2. The device 98 of FIG. 16(*b*) may also include one or more small ballast resistors 71 connected to one or more of the emitter fingers and/or the base.

FIG. 16(*c*) shows the measured power performance data of the device of FIG. 16(*b*) compared to the prior art device of FIG. 16(*a*), when both HBTs are fabricated on the same chip and operated at the same bias and input signal levels. The results shown in FIG. 16(*c*) demonstrate that output power, power gain and power added efficiency are simultaneously improved using the 2-dimensional layout of the device 98 of FIG. 16(*b*) compared to the 1-dimensional prior-art device 96 of FIG. 16(*a*).

There are various possibilities with regard to alternative embodiments of a solid state high power device and method according to an exemplary embodiment.

In any device according to the various embodiments disclosed herein, the thermal stability of each individual emitter finger or subcell is preferably maintained, to ensure thermal stability of a composite structure that comprises all the emitter fingers or subcells together. To ensure the stability of the individual emitter fingers of a GaAs device, each finger may be less than 2 microns wide, preferably approximately one micron wide.

To ensure the stability of the individual emitter fingers of a GaAs device, the substrate thickness should also be thinned to a certain thickness depending on the overall heat dissipation of the device and finger width, so that the substrate thickness may be less than 130 microns, and preferably approximately 100 microns. A GaAs device having an emitter finger width less than 2 microns and a substrate thickness less than 130 microns is particularly preferred.

The foregoing description of exemplary embodiments of the invention have been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A transistor comprising:
 a collector;
 a base, at least a portion of the base disposed on a portion of the collector;
 an emitter; and
 a first plurality of emitter subcells extending from the emitter, the first plurality of emitter subcells formed on a first portion of the base, an emitter subcell including an emitter finger;
 wherein the first plurality of emitter subcells are arranged to extend generally parallel to each other and to form a first arc-shaped row;
 wherein the first plurality of emitter subcells includes a first emitter subcell, a second emitter subcell, and a third emitter subcell, wherein the first emitter subcell is closer to a center of the first arc-shaped row than either of the second emitter subcell and the third emitter subcell, and further wherein the third emitter subcell is farther from the center of the first arc-shaped row than either of the first emitter subcell and the second emitter subcell, wherein a first distance between the first emitter subcell and the second emitter subcell is greater than a second distance between the second emitter subcell and the third emitter subcell.

2. The transistor of claim 1, wherein the first plurality of emitter subcells are symmetrically arranged with respect to each other about a first axis.

3. The transistor of claim 1, further comprising a ballast resistor electrically connected in series with at least one of the emitter fingers.

4. The transistor of claim 1, wherein the second emitter subcell includes a greater number of emitter fingers than the first emitter subcell.

5. The transistor of claim 1, further comprising:
 a second plurality of emitter subcells extending from the emitter, the second plurality of emitter subcells formed on the first portion of the base;
 wherein the second plurality of emitter subcells are arranged in a second arc-shaped row.

6. The transistor of claim 5, wherein the second arc-shaped row is a mirror image of the first arc-shaped row relative to a plane extending between the first arc-shaped row and the second arc-shaped row.

7. The transistor of claim 5, further comprising:
 a third plurality of emitter subcells extending from the emitter, the third plurality of emitter subcells formed on the first portion of the base;
 wherein the third plurality of emitter subcells are arranged in a third row, the third row arranged between the first arc-shaped row and the second arc-shaped row.

8. The transistor of claim 7, wherein the third plurality of emitter subcells are arranged in the third row on either side of a central gap.

9. A transistor comprising:
 a collector;
 a base, at least a portion of the base disposed on a portion of the collector;
 an emitter; and
 a first plurality of emitter sub cells extending from the emitter, the first plurality of emitter subcells formed on a first portion of the base, an emitter subcell including an emitter finger;
 wherein the first plurality of emitter sub cells are arranged to extend generally parallel to each other on either side of a central gap and in a first arc-shaped row; and
 further wherein the first plurality of emitter subcells includes a first emitter subcell, a second emitter subcell, and a third emitter subcell, wherein the second emitter subcell includes a greater number of emitter fingers than the first emitter subcell; and further wherein the first emitter subcell is closer to a center of the first row than either of the second emitter subcell and the third emitter subcell, and further wherein the third emitter subcell is farther from the center of the first row than either of the first emitter subcell and the second emitter subcell, wherein a first distance between the first emitter subcell and the second emitter subcell is greater than a second distance between the second emitter subcell and the third emitter subcell.

10. The transistor of claim 9, further comprising a ballast resistor electrically connected in series with at least one of the emitter fingers.

11. The transistor of claim 9, further comprising a ballast resistor electrically connected in series with at least one of the emitter fingers wherein a resistance of the ballast resistor is selected based on at least one of the first distance and the second distance.

12. The transistor of claim 9, wherein the first plurality of emitter subcells are symmetrically arranged with respect to each other about a first axis.

13. The transistor of claim 9, further comprising:
 a second plurality of emitter sub cells extending from the emitter, the second plurality of emitter subcells formed on the first portion of the base;
 wherein the second plurality of emitter subcells are arranged in a second row.

14. The transistor of claim 13, further comprising:
 a third plurality of emitter subcells extending from the emitter, the third plurality of emitter subcells formed on the first portion of the base;
 wherein the third plurality of emitter subcells are arranged in a third row, the third row arranged between the first arc-shaped row and the second row.

15. The transistor of claim 13, wherein the second plurality of emitter subcells are arranged in the second row on either side of a second central gap.

16. The transistor of claim 13, wherein the second row is arc-shaped.

17. The transistor of claim 16, wherein the first plurality of emitter subcells and the second plurality of emitter subcells are symmetrically arranged with respect to each other about a first axis.

18. A transistor comprising:
 a collector;
 a base, at least a portion of the base disposed on a portion of the collector;
 an emitter;
 a first emitter subcell including an emitter finger extending from a first portion of the emitter, the first emitter sub cell formed on a first portion of the base and further including a first lateral side and a second lateral side opposite the first lateral side; and
 a second emitter subcell including an emitter finger extending from a second portion of the emitter, the second emitter subcell formed on a second portion of the base and further including a first lateral side and a second lateral side opposite the first lateral side, wherein the first lateral side of the second emitter subcell is proximate the second lateral side of the first emitter subcell;
 a third emitter subcell including an emitter finger extending from a third portion of the emitter, the third emitter subcell formed on a third portion of the base and further including a first lateral side and a second lateral side opposite the first lateral side, wherein the first lateral side of the third emitter subcell is proximate the second lateral side of the second emitter subcell;

wherein the first emitter subcell, the second emitter subcell, and the third emitter subcell are arranged in a row;

wherein the first lateral side of the first emitter subcell and the first lateral side of the second emitter subcell are separated by a first distance;

wherein the first lateral side of the second emitter subcell and the first lateral side of the third emitter sub cell are separated by a second distance, and further wherein the first distance is greater than twice the second distance.

19. A transistor comprising:

a collector;

a base, at least a portion of the base disposed on a portion of the collector;

an emitter; and a first plurality of emitter subcells extending from the emitter, the first plurality of emitter subcells formed on a first portion of the base, an emitter subcell including an emitter finger;

wherein the first plurality of emitter subcells are arranged to extend generally parallel to each other on either side of a central gap and in a first row; and further wherein the first plurality of emitter subcells includes a first emitter subcell, a second emitter subcell, and a third emitter subcell, wherein the first emitter subcell is closer to a center of the first row than either of the second emitter subcell and the third emitter subcell, and further wherein the third emitter subcell is farther from the center of the first row than either of the first emitter subcell and the second emitter subcell, wherein a first distance between the first emitter subcell and the second emitter subcell is greater than a second distance between the second emitter subcell and the third emitter subcell.

20. The transistor of claim 19, wherein the second emitter subcell includes a greater number of emitter fingers than the first emitter subcell.

21. The transistor of claim 20, further comprising a ballast resistor electrically connected in series with at least one of the emitter fingers wherein a resistance of the ballast resistor is selected based on at least one of the first distance and the second distance.

* * * * *

UNITED STATES PATENT AND TRADEMARK OFFICE
CERTIFICATE OF CORRECTION

PATENT NO. : 7,705,425 B2 Page 1 of 1
APPLICATION NO. : 11/498665
DATED : April 27, 2010
INVENTOR(S) : Zhenqiang Ma and Ningyue Jiang It is certified that error appears in the above-identified patent and that said Letters Patent is hereby corrected as shown below:

IN THE CLAIMS

Claim 9, Column 13, Line 60:
Delete "sub cells" and replace with --subcells--.

Claim 13, Column 14, Line 27:
Delete "sub cells" and replace with --subcells--.

Claim 18, Column 14, Lines 54-55:
Delete "sub cell" and replace with --subcell--.

Claim 18, Column 15, Line 11:
Delete "sub cell" and replace with --subcell--.

Signed and Sealed this

Fifteenth Day of June, 2010

David J. Kappos
*Director of the United States Patent and Trademark Office*